United States Patent
Lai et al.

(10) Patent No.: US 12,527,005 B2
(45) Date of Patent: Jan. 13, 2026

(54) MEMORY DEVICE AND METHOD FOR MANUFACTURING THE SAME

(71) Applicant: MACRONIX INTERNATIONAL CO., LTD., Hsinchu (TW)

(72) Inventors: Erh-Kun Lai, Taichung County (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 409 days.

(21) Appl. No.: 18/306,289

(22) Filed: Apr. 25, 2023

(65) Prior Publication Data
US 2024/0365565 A1 Oct. 31, 2024

(51) Int. Cl.
*H10B 63/00* (2023.01)
*H10B 61/00* (2023.01)

(52) U.S. Cl.
CPC ............ *H10B 63/34* (2023.02); *H10B 61/22* (2023.02); *H10B 63/845* (2023.02)

(58) Field of Classification Search
CPC ...... H10B 63/34; H10B 61/22; H10B 63/845; H10B 63/10; H10B 63/84; H10N 70/8833
See application file for complete search history.

(56) References Cited

U.S. PATENT DOCUMENTS

| | | | |
|---|---|---|---|
| 11,133,329 B2 | 9/2021 | Lue | |
| 11,342,381 B2 | 5/2022 | Yano | |
| 11,476,276 B2 * | 10/2022 | Lee | H01L 23/5226 |
| 11,871,588 B2 * | 1/2024 | Lee | H10N 50/01 |
| 2017/0338243 A1 | 11/2017 | Sohn | |
| 2022/0013535 A1 | 1/2022 | Lue | |
| 2022/0130862 A1 * | 4/2022 | Lue | H10B 51/10 |
| 2022/0189990 A1 | 6/2022 | Or-Bach | |
| 2023/0292531 A1 * | 9/2023 | Lin | H10B 63/10 |

FOREIGN PATENT DOCUMENTS

| | | |
|---|---|---|
| TW | 202111925 A | 3/2021 |
| TW | 202127657 A | 7/2021 |
| TW | 202308128 A | 2/2023 |

OTHER PUBLICATIONS

Fu, et al.: "A Novel Confined Nitride-Trapping Layer Device for 3D Nand Flash with Robust Retention Performances"; 2019 Symposium on VLSI Technology Digest of Technical Papers; pp. 1-2.

* cited by examiner

*Primary Examiner* — Allison Bernstein
(74) *Attorney, Agent, or Firm* — McClure, Qualey & Rodack, LLP

(57) ABSTRACT

A memory device and a method for manufacturing the same are provided. The memory device includes drain pillar structures, source pillar structures, memory structures surrounding the drain pillar structures respectively, a channel structure, and a gate structure surrounding the drain pillar structures, the source pillar structures and the channel structure. The channel structure is divided into arc channel parts by the drain pillar structures and the source pillar structures.

19 Claims, 20 Drawing Sheets

MEMORY DEVICE AND METHOD FOR MANUFACTURING THE SAME

BACKGROUND

Technical Field

The disclosure relates to a memory device and a method for manufacturing the same, and more particularly to a three-dimensional memory device and a method for manufacturing the same.

Description of the Related Art

The three-dimensional memory devices are currently the mainstream technology due to their high bit density. However, most of the three-dimensional memory devices still have some electrical problems. There is still a need to provide an improved three-dimensional memory device and a method for manufacturing the same.

SUMMARY

According to an embodiment of the present disclosure, a memory device is provided. The memory device includes drain pillar structures, source pillar structures, memory structures surrounding the drain pillar structures respectively, a channel structure, and a gate structure surrounding the drain pillar structures, the source pillar structures and the channel structure. The channel structure is divided into arc channel parts by the drain pillar structures and the source pillar structures.

According to an embodiment of the present disclosure, a method for manufacturing a memory device is provided. The method for manufacturing the memory device includes: providing a stack structure; forming an opening penetrating the stack structure; forming a channel structure in the stack structure, wherein the opening exposes an inner surface of the channel structure; forming first holes penetrating the stack structure, wherein the opening partly overlaps the first holes, and the first holes penetrate the channel structure; forming a source pillar structure in each of the first holes; forming second holes penetrating the stack structure, wherein the opening partly overlaps the second holes, and the second holes penetrate the channel structure; forming a memory structure and a drain pillar structure in each of the second holes; forming a gate structure surrounding the drain pillar structures and the source pillar structures.

The above and other embodiments of the disclosure will become better understood with regard to the following detailed description of the non-limiting embodiment(s). The following description is made with reference to the accompanying drawings.

DETAILED DESCRIPTION

Figure 1A:
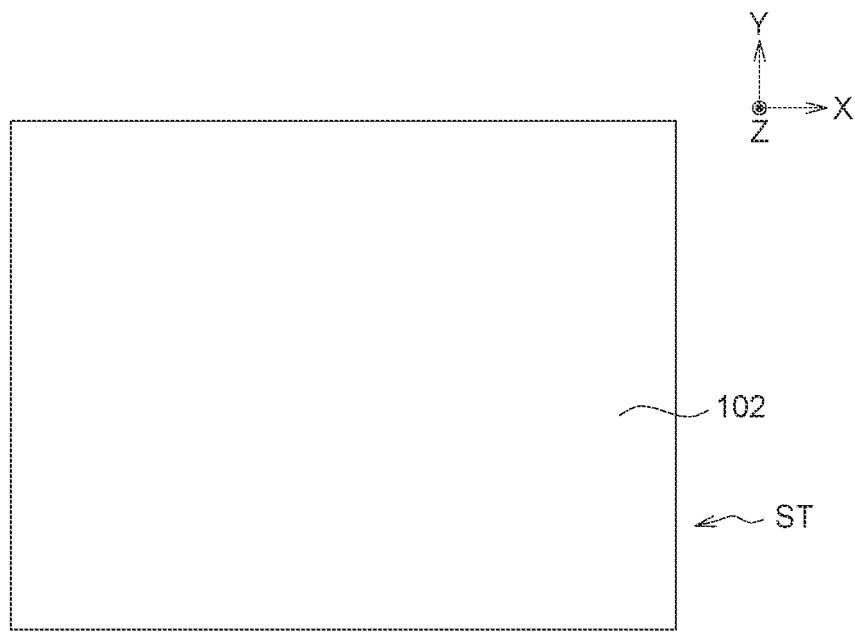
FIGS. 1A-10D illustrate a memory device and a method for manufacturing a memory device according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

The embodiments of the present disclosure could be implemented in many different three-dimensional memory devices in the applications. For example, the embodiment could be applied to, but not limited to, three-dimensional resistive memory devices. The resistive memory devices refer to any memory devices involving changing resistance, such as transition metal oxide resistive random-access memory (TMO ReRAM), conductive bridging random access memory (CBRAM), phase change memory (PCM), magnetoresistive random access memory (MRAM) or other suitable resistive memory devices. In addition, the memory devices according to the embodiments of the present disclosure can be applied to 3D AND memory, but the present disclosure is not limited thereto.

FIGS. 1A-10D illustrate a memory device 10 and a method for manufacturing a memory device according to an embodiment of the present disclosure.

Figure 1B:
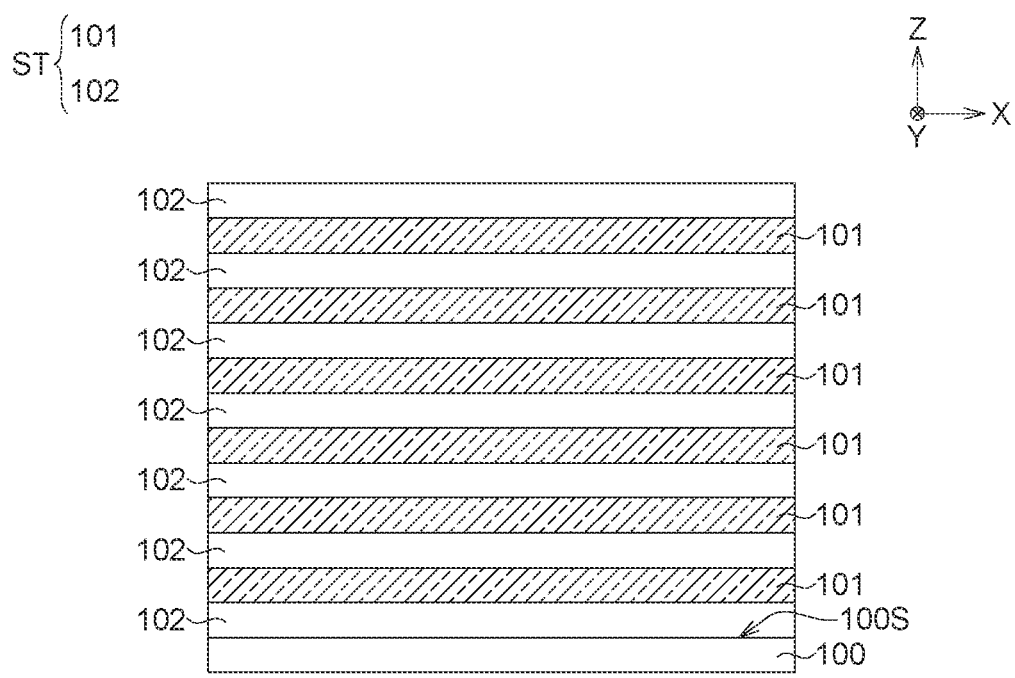

Referring to FIGS. 1A-1B, FIG. 1A illustrates a schematic top view of a structure at a stage of the manufacturing method, and FIG. 1B illustrates a cross-sectional view of the structure at the stage. A substrate 100 is provided. A stack structure ST is formed on an upper surface 100S of the substrate 100. The stack structure ST includes first insulating layers 101 and second insulating layers 102 stacked alternately on the upper surface 100S of the substrate 100. The first insulating layers 101 and the second insulating layers 102 are stacked alternately along the Z direction. The Z direction may be a direction of a normal to the upper surface 100S of the substrate 100. The first insulating layers 101 are separated from each other by the second insulating layers 102. In the present embodiment, the topmost layer and the bottommost layer of the stack structure ST are second insulating layers 102, and six first insulating layers 101 and seven second insulating layers 102 are shown, but the present disclosure is not limited thereto. The number and arrangement of the first insulating layers 101 and the second insulating layers 102 can be adjusted freely. The topmost insulating layer 102 of the stack structure ST can be used as a hard mask. In an embodiment, the substrate 100 includes an insulating material, and the insulating material includes oxide such as silicon oxide. In an embodiment, the substrate 100 includes a doped or undoped semiconductor material, such as doped or undoped silicon (Si). In an embodiment, the substrate 100 includes a conductive material. The first insulating layer 101 may include an insulating material, and the insulating material includes nitride such as silicon nitride. The second insulating layer 102 may include an insulating material, and the insulating material includes oxide such as silicon oxide. In an embodiment, the first insulating layer 101 and the second insulating layer 102 include different materials. In an embodiment, the stack structure ST is formed by forming the first insulating layers 101 and the second insulating layers 102 alternately on the upper surface 100S of the substrate 100 through a deposition process.

Figure 2A:
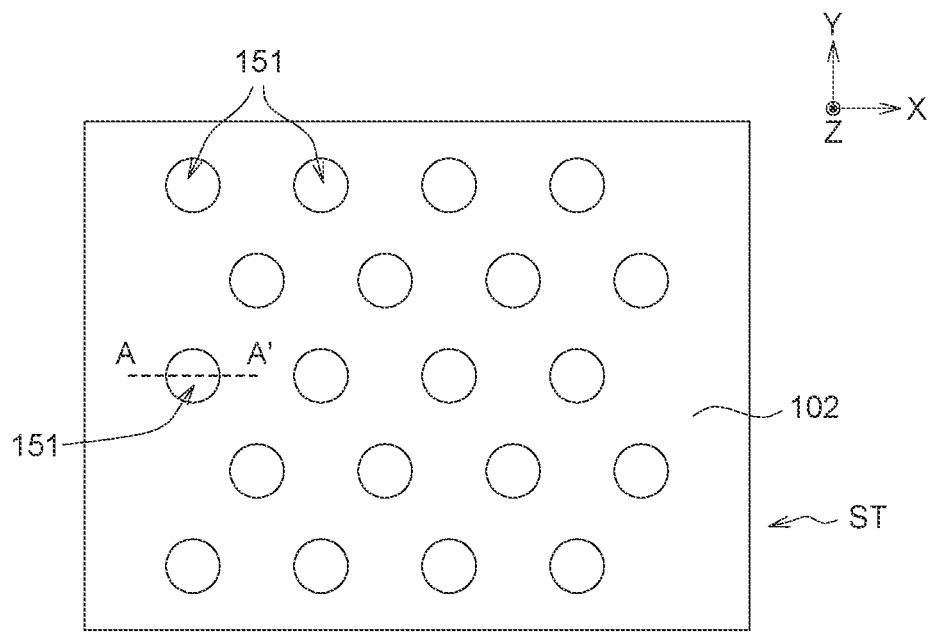
Figure 2B:
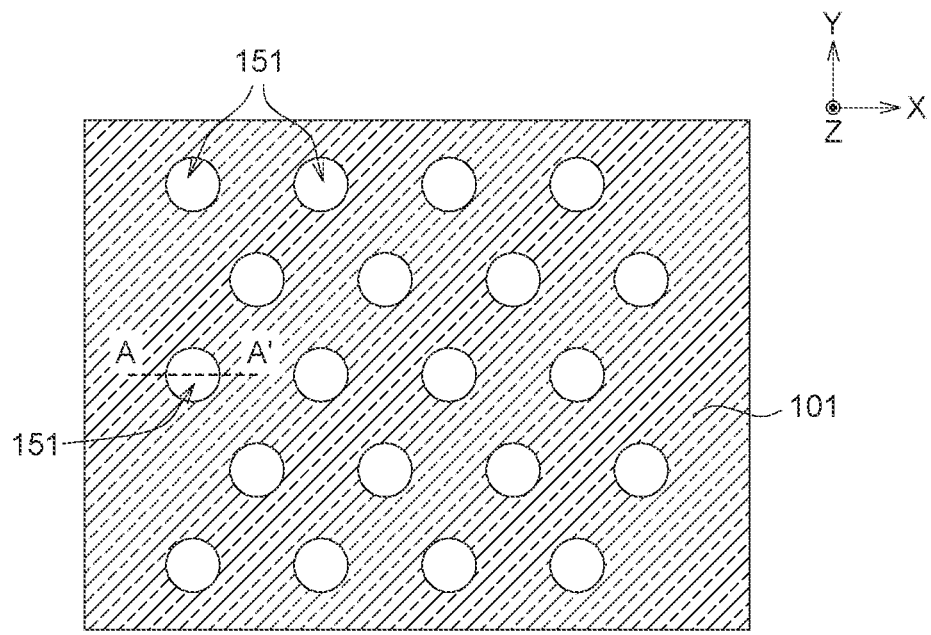
Figure 2C:
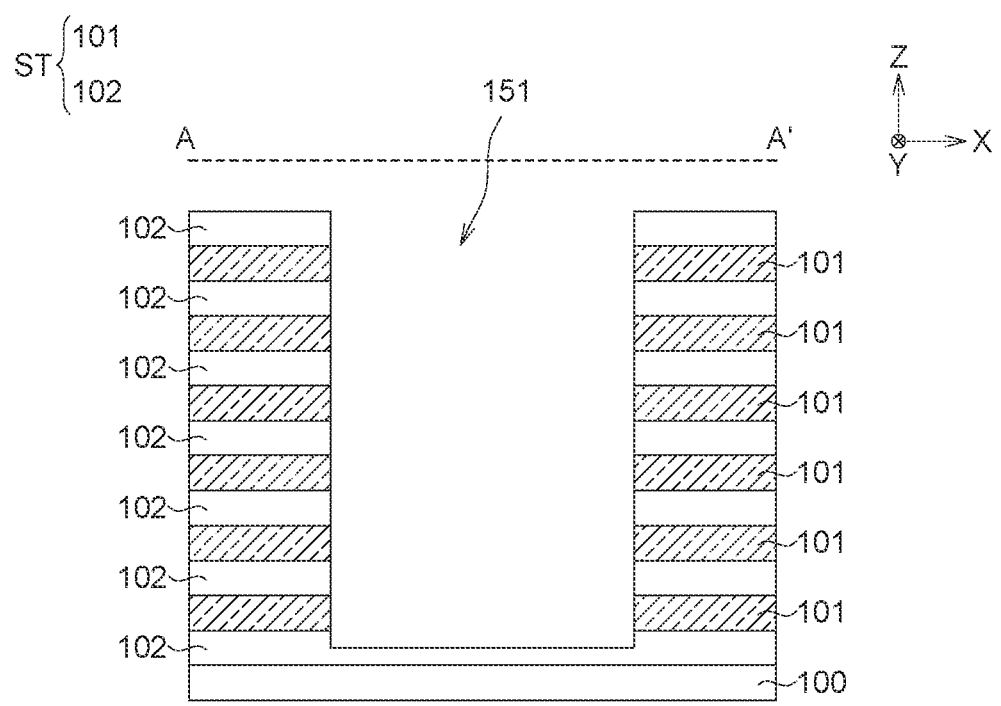

Referring to FIGS. 2A-2C, FIG. 2A illustrates a schematic top view of a structure at a stage of the manufacturing method, FIG. 2B illustrates a schematic top view of the structure, corresponding to a plane of a first insulating layer 101, at the stage of the manufacturing method, and FIG. 2C is a cross-sectional view of the structure at the stage illustrated along the lines AA' shown in FIGS. 2A-2B. The stack structure ST is patterned so that openings 151 are formed on the substrate 100 and in the stack structure ST. The openings 151 are separated from each other. The opening 151 may have any shape such as a cylindrical shape, an elliptical cylindrical shape, or a square cylindrical shape. The openings 151 extend downward along the Z direction, penetrate the stack structure ST, and stop at the bottommost second insulating layer 102 in the stack structure ST. The openings 151 expose sidewalls of the stack structure ST (which may be considered as sidewalls of the openings 151) and expose the bottommost second insulating layer 102 in the stack structure ST (which may be considered as bottoms of the openings 151). In an embodiment, the stack structure ST is patterned through a photolithography process. In an embodiment, openings 151 can be arranged in the stack structure ST in a hexagonal array, but the present disclosure is not limited thereto.

Figure 3A:
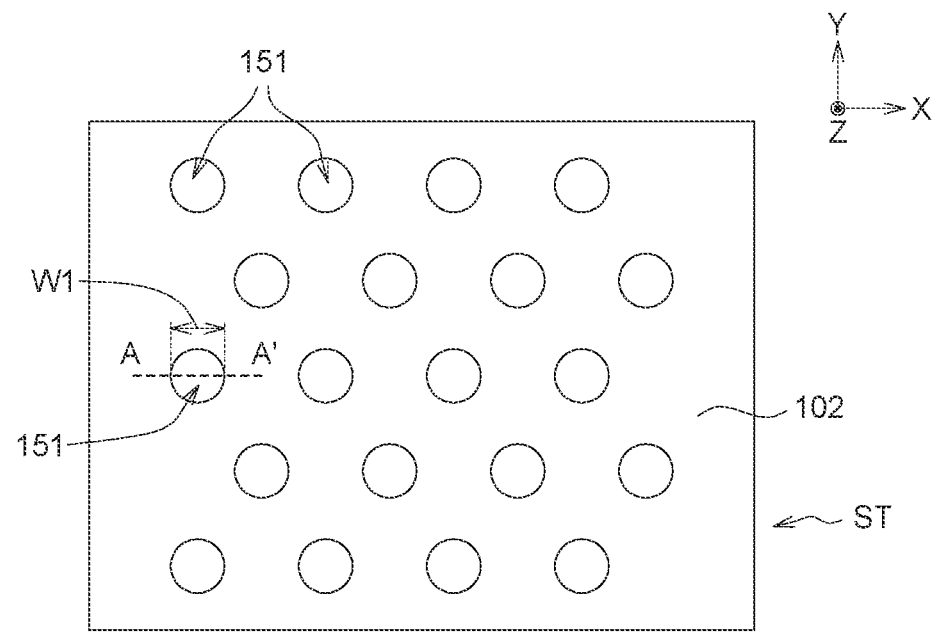
Figure 3B:
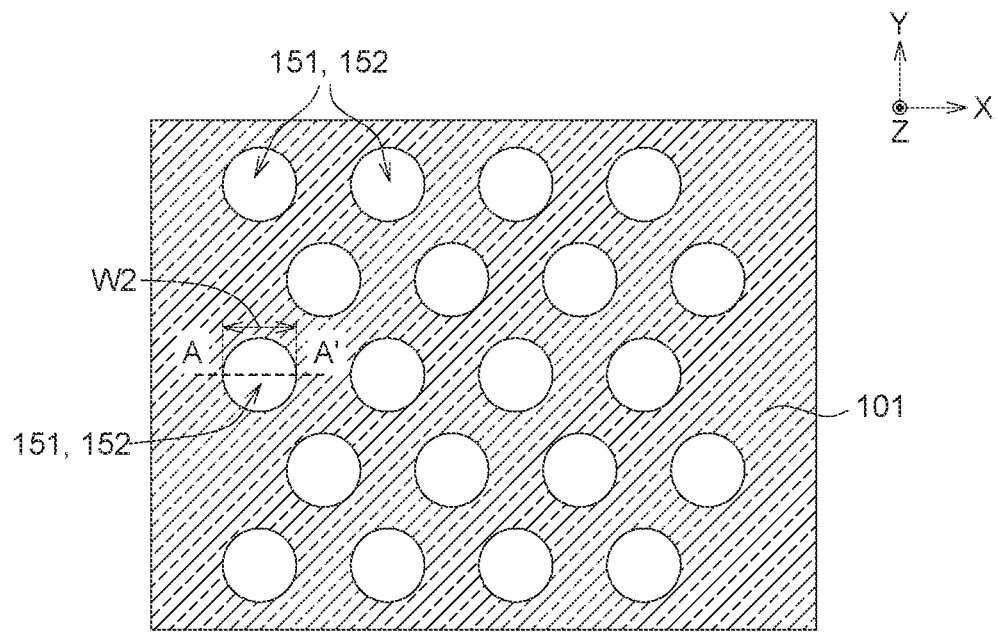
Figure 3C:
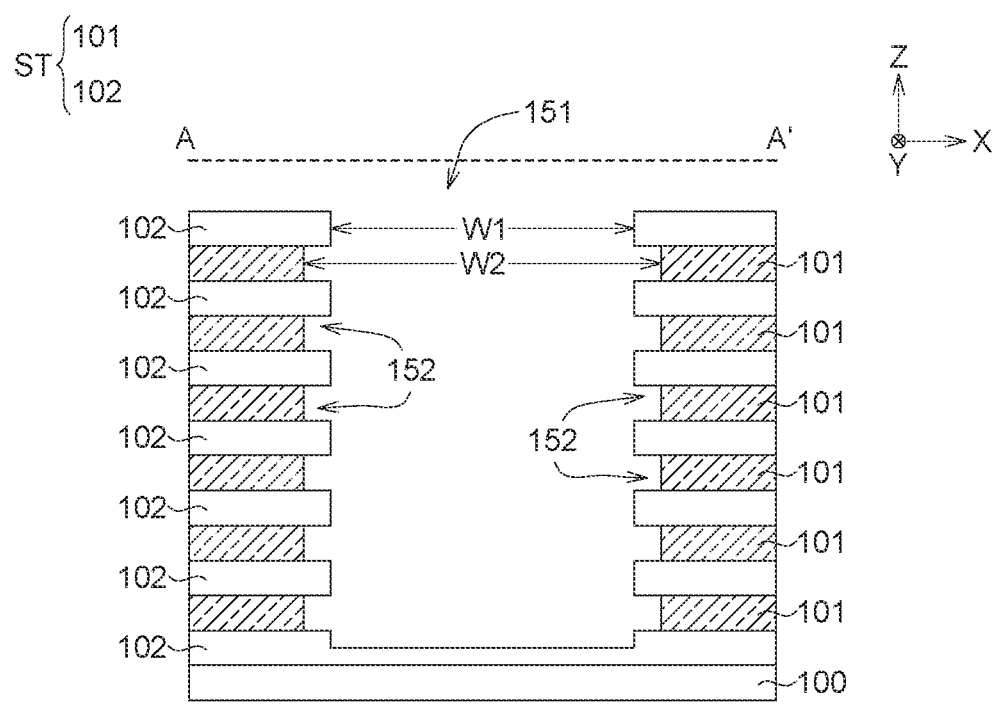

Referring to FIGS. 3A-3C, FIG. 3A illustrates a schematic top view of a structure at a stage of the manufacturing method, FIG. 3B illustrates a schematic top view of the structure, corresponding to the plane of the first insulating layer 101, at the stage of the manufacturing method, and FIG. 3C is a cross-sectional view of the structure at the stage illustrated along the lines AA' shown in FIGS. 3A-3B. A portion of the first insulating layers 101 is removed to pull back the first insulating layers 101 and form recesses 152. The recesses 152 are between the second insulating layers 102. The recesses 152 are separated from each other by the second insulating layers 102. The recess 152 may have an annular shape surrounding the opening 151. The recesses 152 and the opening 151 may communicate with each other. In a plane formed by the X direction and the Y direction, the opening 151 has a diameter W1, the recess 152 has a recess width W2, and the recess width W2 of the recess 152 can be greater than the diameter W1 of the opening 151. The X direction, the Y direction and the Z direction are perpendicular to each other. In an embodiment, a portion of the first insulating layers 101 is removed through a dry etching process or a wet etching process. For example, the dry etching process in this step is a reactive ion etching (RIE) process. For example, the wet etching process in this step is a wet etching process with phosphoric acid ($H_3PO_4$).

Figure 4A:
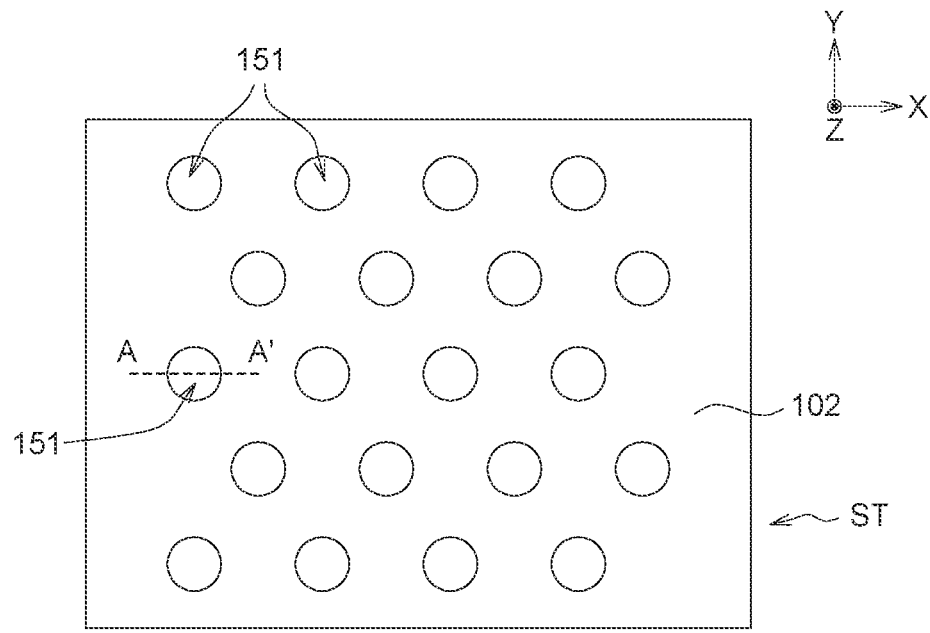
Figure 4B:
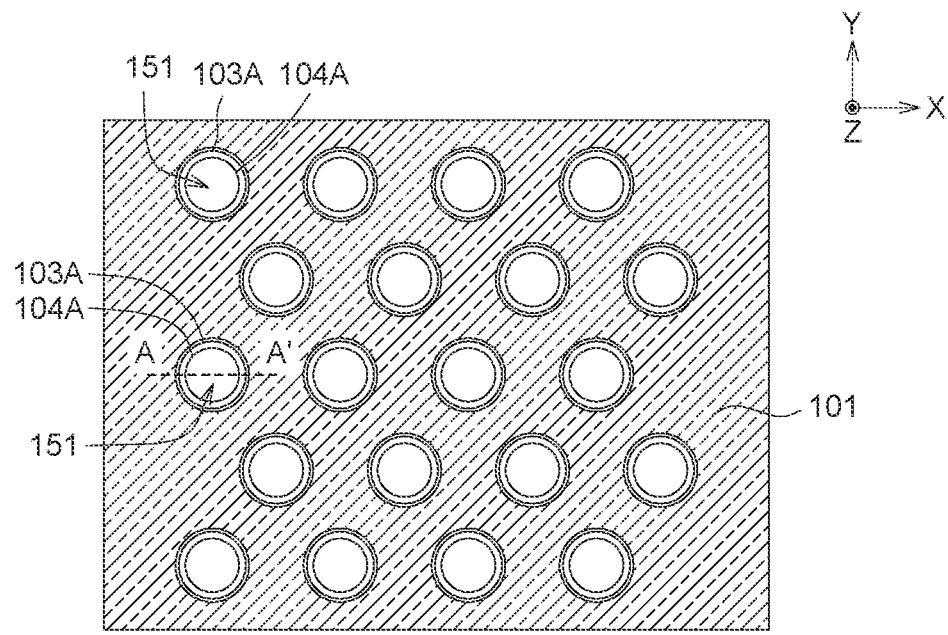
Figure 4C:
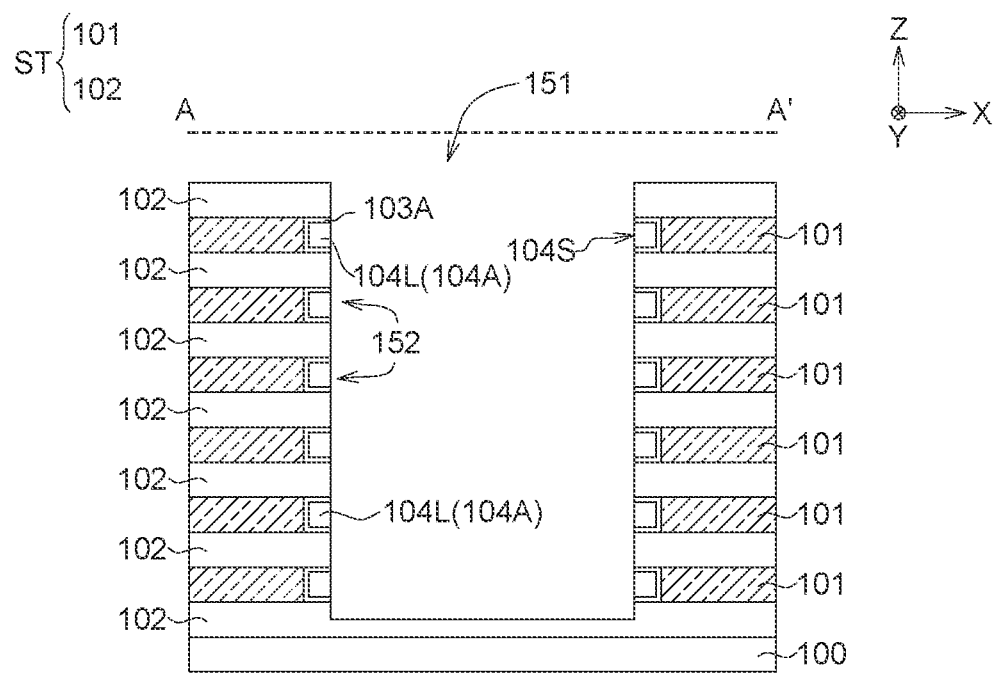

Referring to FIGS. 4A-4C, FIG. 4A illustrates a schematic top view of a structure at a stage of the manufacturing method, FIG. 4B illustrates a schematic top view of the structure, corresponding to the plane of the first insulating layer 101, at the stage of the manufacturing method, and FIG. 4C is a cross-sectional view of the structure at the stage illustrated along the lines AA' shown in FIGS. 4A-4B. Oxide structures 103A and channel structures 104A are formed in the stack structure ST through the openings 151. The oxide structures 103A and the channel structures 104A are formed in the recesses 152. The oxide structure 103A is between the channel structure 104A and the first insulating layers 101. The oxide structure 103A may cover an upper surface, a lower surface and a sidewall of the channel structure 104A. The oxide structure 103A may surround the channel structure 104A and the opening 151, as shown in FIG. 4B. The channel structure 104A surrounds the opening 151, as shown in FIG. 4B. The opening 151 exposes an inner surface 104S of the channel structure 104A. The oxide structure 103A may include silicon oxide, a high dielectric constant material or other suitable materials. The channel structure 104A may include a silicon-based material or an oxide-based material. The silicon-based material may include amorphous silicon (a-Si), doped or undoped polycrystalline silicon and so on. The oxide-based material may include InGaZnO, AlZnO, InZnO and so on. In an embodiment, the oxide structures 103A are formed in the recesses 152 through a deposition process, and the oxide structures 103A are formed on sidewalls of the first insulating layers 101 exposed by the recesses 152, on upper surfaces of the second insulating layers 102 exposed by the recesses 152 and on lower surfaces of the second insulating layers 102 exposed by the recesses 152; a channel material is then filled in the remaining spaces of the recesses 152 and in the openings 151 through a deposition process; a portion of the channel material in the openings 151 is then removed through an etching back process, and a portion of the channel material in the recesses 152 remains to seal the recesses 152. The portion of the channel material in the recesses 152 may be defined as channel layers 104L. The channel layers 104L disposed apart along the Z direction (e.g. a third direction) may be defined as the channel structure 104A. An oxide structure 103A corresponds to an opening 151. A channel structure 104A corresponds to an opening 151.

Figure 4D:
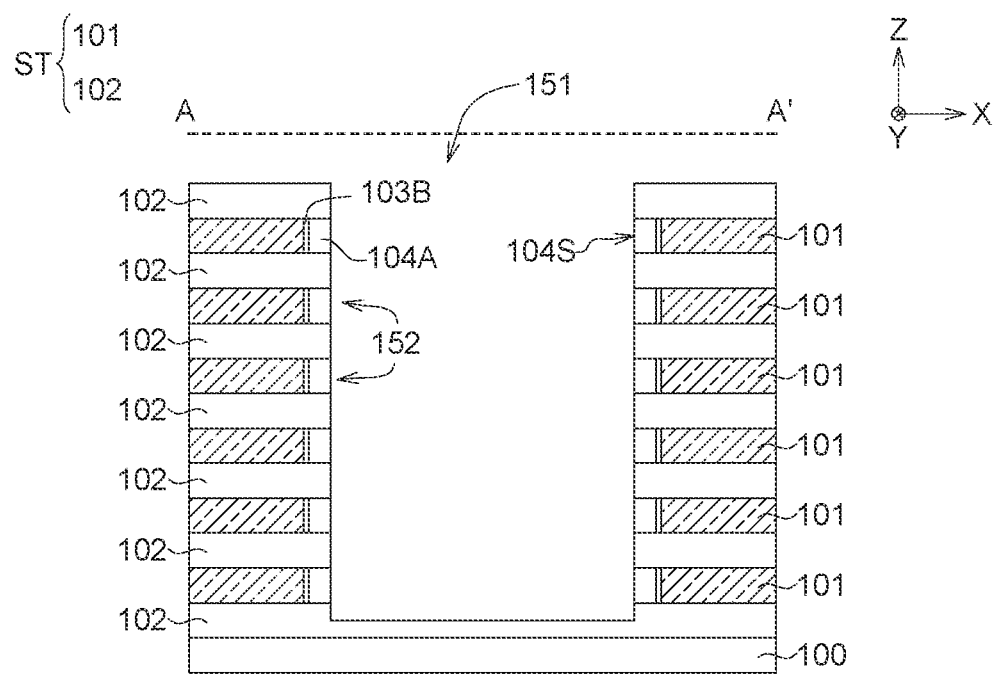

FIG. 4D illustrates a cross-sectional view of an oxide structure 103B according to another embodiment of the present disclosure. In this embodiment, the oxide structure 103B may not cover the upper surface and the lower surface of the channel structure 104A, and the oxide structure 103B may cover the sidewall of the channel structure 104A. An oxidation process may be performed to the first insulating layers 101 to oxidize a portion of the first insulating layers 101, and the oxidized portion of the first insulating layers 101 may be defined as the oxide structure 103B. For example, a portion of the first insulating layers 101 can be oxidized by an in-situ steam generation oxidation, ISSG oxidation process to form the oxide structure 103B. After the formation of oxide structure 103B, the steps described above can be performed to form the channel structure 104A. The oxide structure 103B may include silicon oxide, a high dielectric constant material or other suitable materials.

Figure 5A:
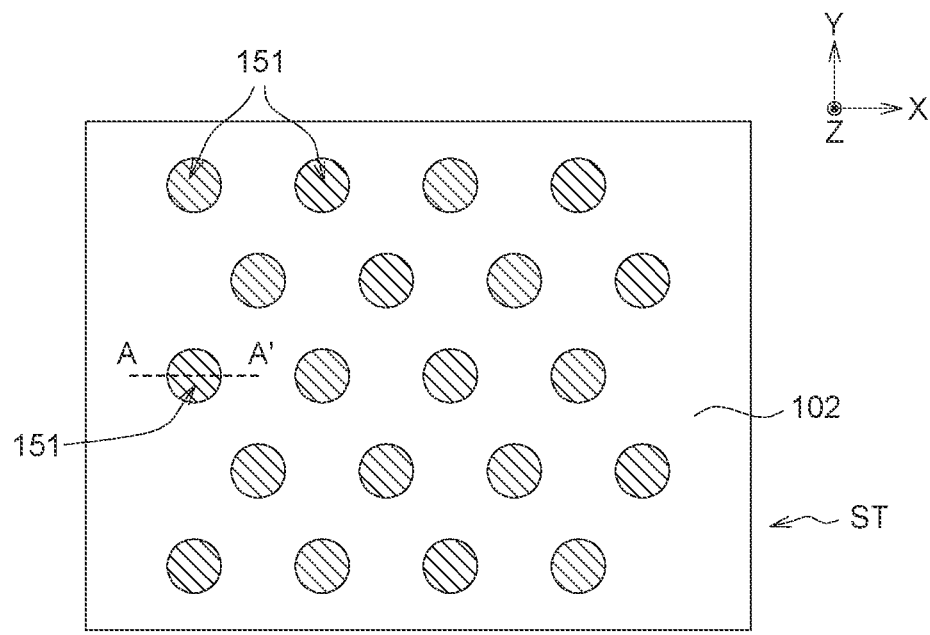
Figure 5B:
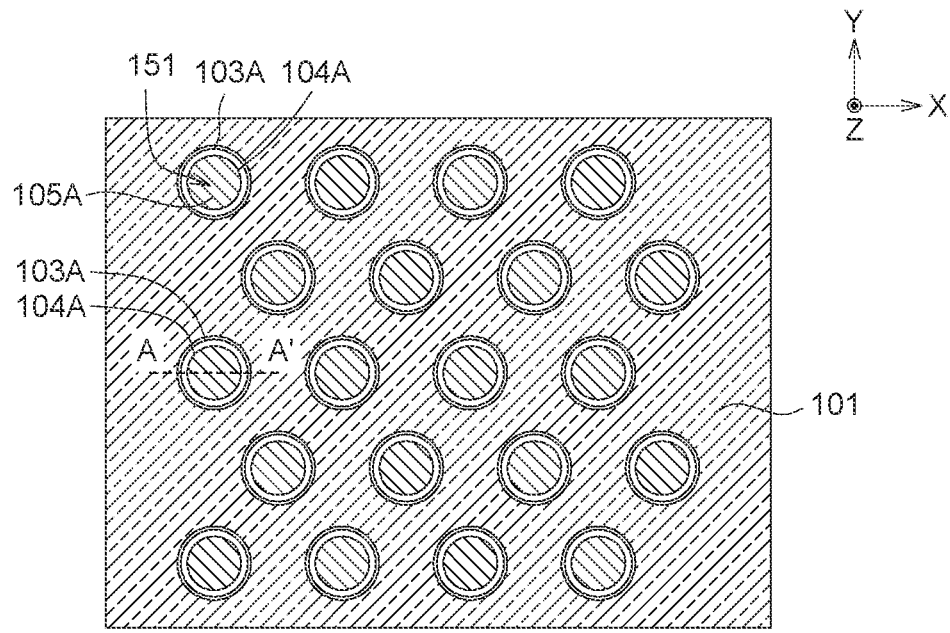
Figure 5C:
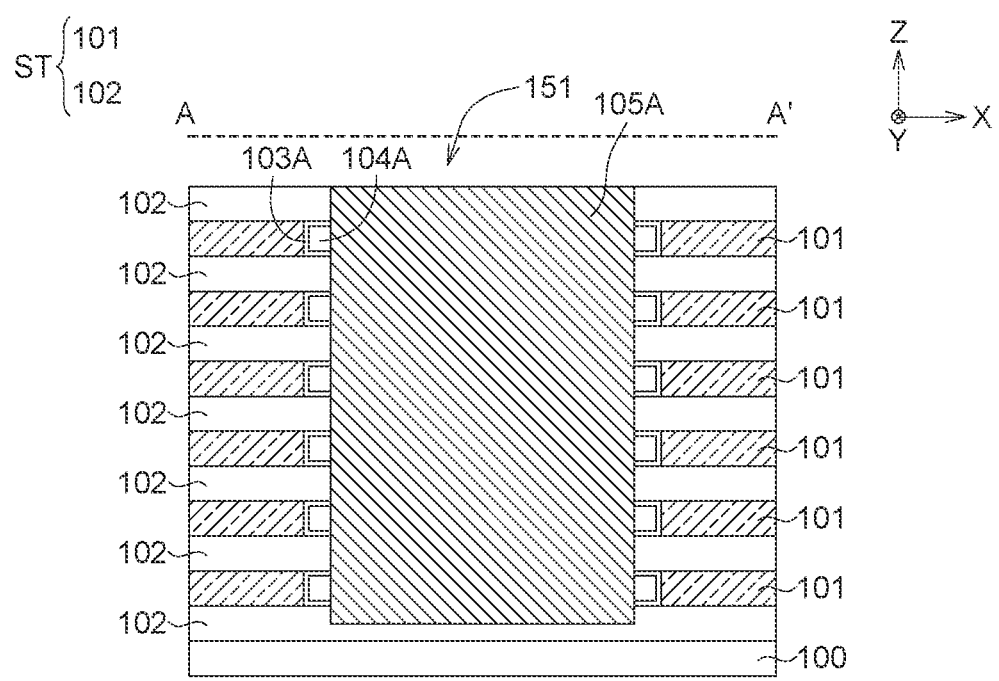

Referring to FIGS. 5A-5C, FIG. 5A illustrates a schematic top view of a structure at a stage of the manufacturing method, FIG. 5B illustrates a schematic top view of the structure, corresponding to the plane of the first insulating layer 101, at the stage of the manufacturing method, and FIG. 5C is a cross-sectional view of the structure at the stage illustrated along the lines AA' shown in FIGS. 5A-5B. Insulating pillar structures 105A are formed in the stack structure ST. The insulating pillar structure 105A may include an insulating material, and the insulating material may include oxide such as silicon monoxide or silicon dioxide. In an embodiment, the material of insulating pillar structures is filled in the openings 151 and on the stack structure ST through a deposition process; a portion of the material of insulating pillar structures on the stack structure ST is then removed through a chemical-mechanical planarization (CMP) process, and a portion of the material of insulating pillar structures in the openings 151 remains. The portion of the material of insulating pillar structures in the openings 151 may be defined as the insulating pillar structures 105A.

Figure 6A:
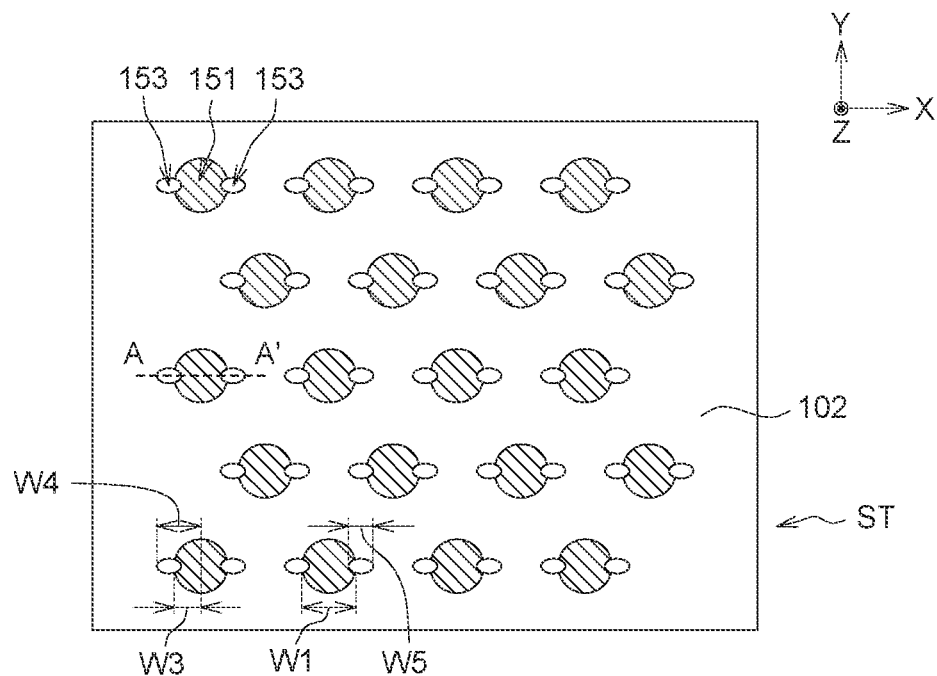
Figure 6B:
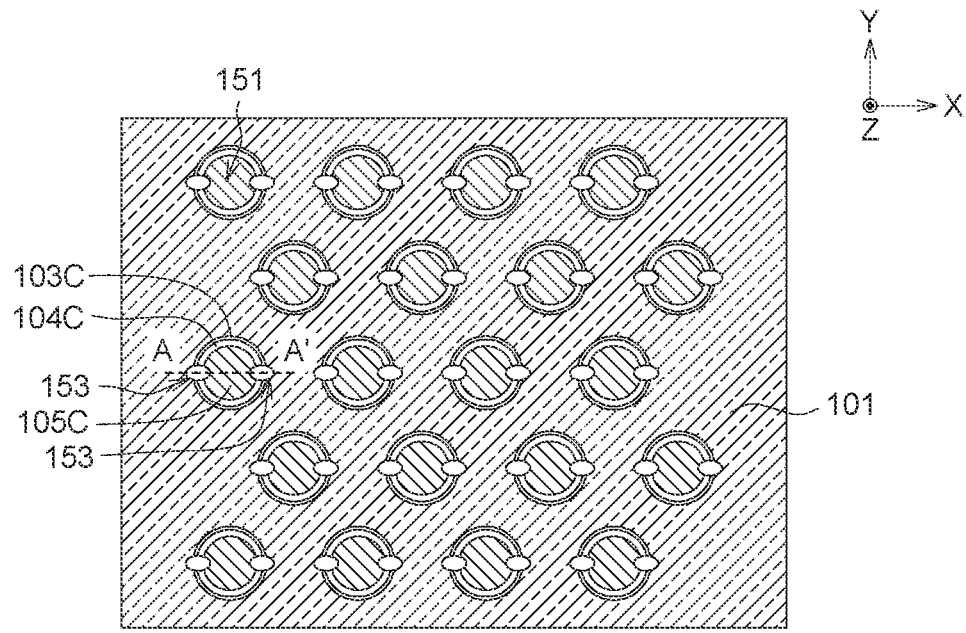
Figure 6C:
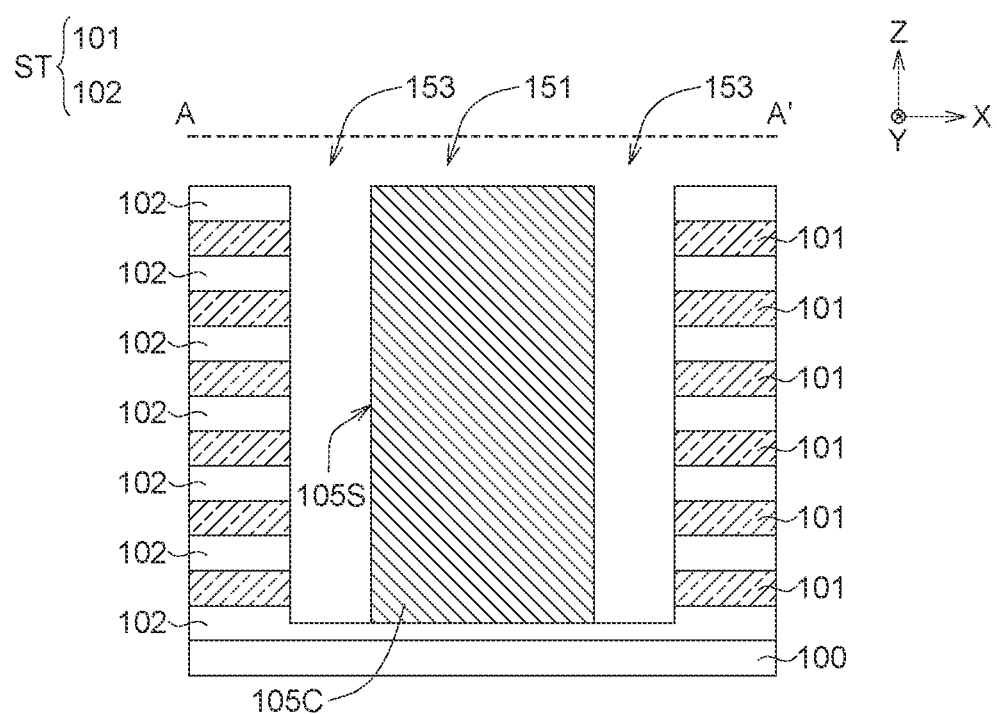

Referring to FIGS. 6A-6C, FIG. 6A illustrates a schematic top view of a structure at a stage of the manufacturing method, FIG. 6B illustrates a schematic top view of the structure, corresponding to the plane of the first insulating layer 101, at the stage of the manufacturing method, and FIG. 6C is a cross-sectional view of the structure at the stage illustrated along the lines AA' shown in FIGS. 6A-6B. The stack structure ST is patterned so that first holes 153 penetrating the stack structure ST are formed. The first holes 153 are separated from each other. Each of the openings 151 partly overlaps more than one first hole 153. In the present embodiment, each of the openings 151 partly overlaps two first holes 153, the two first holes 153 can be disposed on opposite sides of the opening 151 along the X direction, but the present disclosure is not limited thereto. The number and arrangement of the first holes 153 that partly overlap an opening 151 can be adjusted freely. Each first hole 153 is partly within an opening 151 and partly outside the opening 151. The first hole 153 may have any shape such as a cylindrical shape, an elliptical cylindrical shape, or a square cylindrical shape. The first holes 153 extend downward along the Z direction, penetrate the stack structure ST, the oxide structures 103A, the channel structures 104A and the insulating pillar structures 105A, and stop at the bottommost second insulating layer 102 in the stack structure ST. In an embodiment, the stack structure ST is patterned through a photolithography process to form the first holes 153. The step of forming the first holes 153 may include removing a portion of the stack structure ST, a portion of the oxide structures 103A, a portion of the channel structures 104A and a portion of the insulating pillar structures 105A; the remainder of the oxide structures 103A may be defined as the oxide structures 103C; the remainder of the channel structures 104A may be defined as the channel structures 104C; the remainder of the insulating pillar structures 105A may be defined as the insulating pillar structures 105C.

In the present embodiment, the first holes 153 expose sidewalls of the stack structure ST, sidewalls of the oxide structures 103C, sidewalls of the channel structures 104C and outer surfaces 105S of the insulating pillar structures 105C, and expose the bottommost second insulating layer 102 in the stack structure ST (which may be considered as bottoms of the first holes 153). An oxide structures 103C corresponding an opening 151 can be divided into two parts (e.g. two parts disposed along the Y direction in FIG. 6B) separated from each other by two first holes 153. A channel structures 104C corresponding an opening 151 can be divided into two parts (e.g. two parts disposed along the Y direction in FIG. 6B) separated from each other by two first holes 153. As shown in FIG. 6A, in a plane formed by the X direction and the Y direction, the opening 151 has a radius W3 (i.e. one-half of the diameter W1), a maximum distance W4 between an edge of the first hole 153 and a central point of the opening 151 is greater than the radius W3 of the opening 151. In the present embodiment, in a plane formed by the X direction and the Y direction, the first hole 153 has a maximum width W5 smaller than the diameter W1 of the opening 151, but the present disclosure is not limited thereto.

Figure 7A:
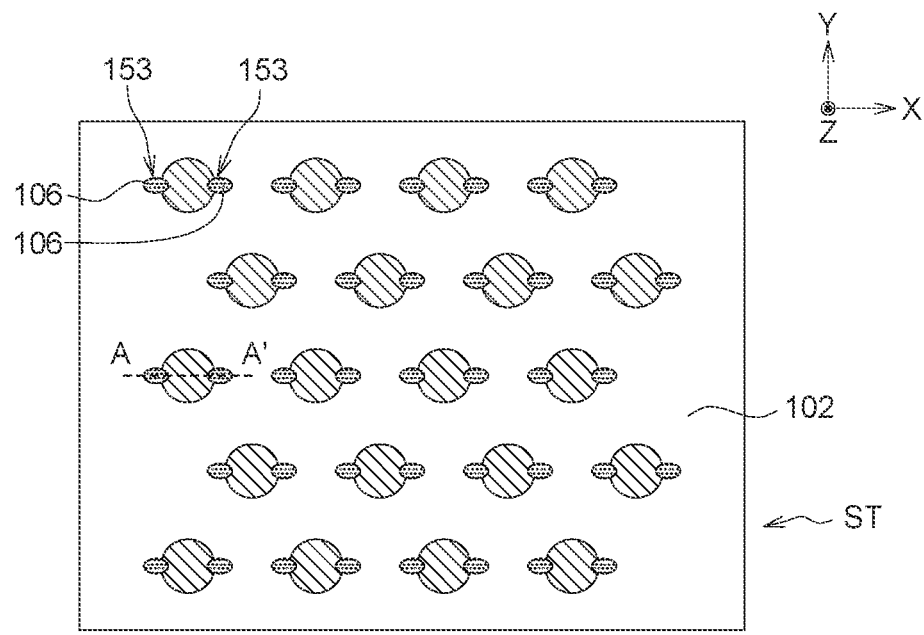
Figure 7B:
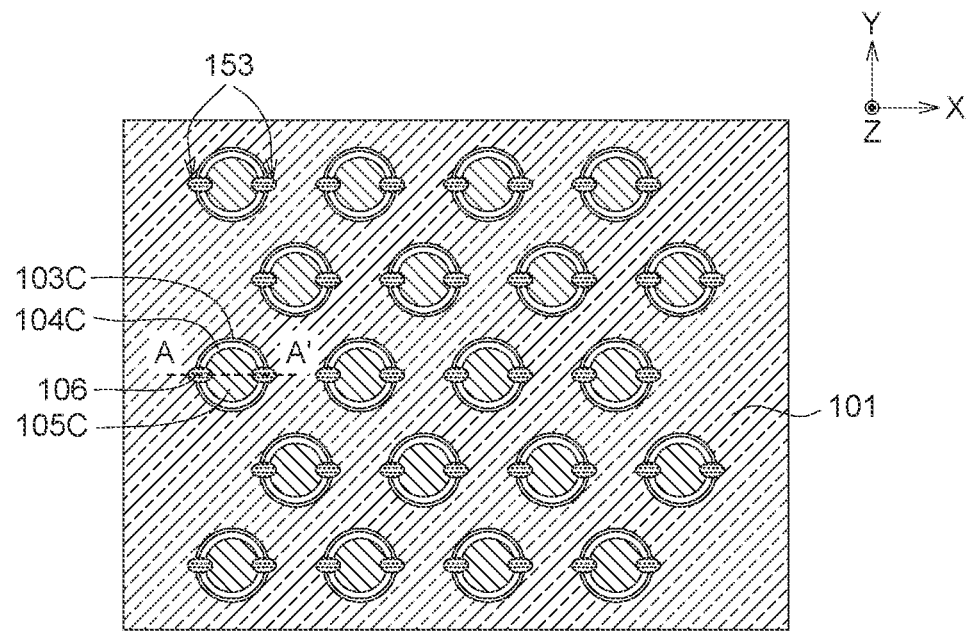
Figure 7C:
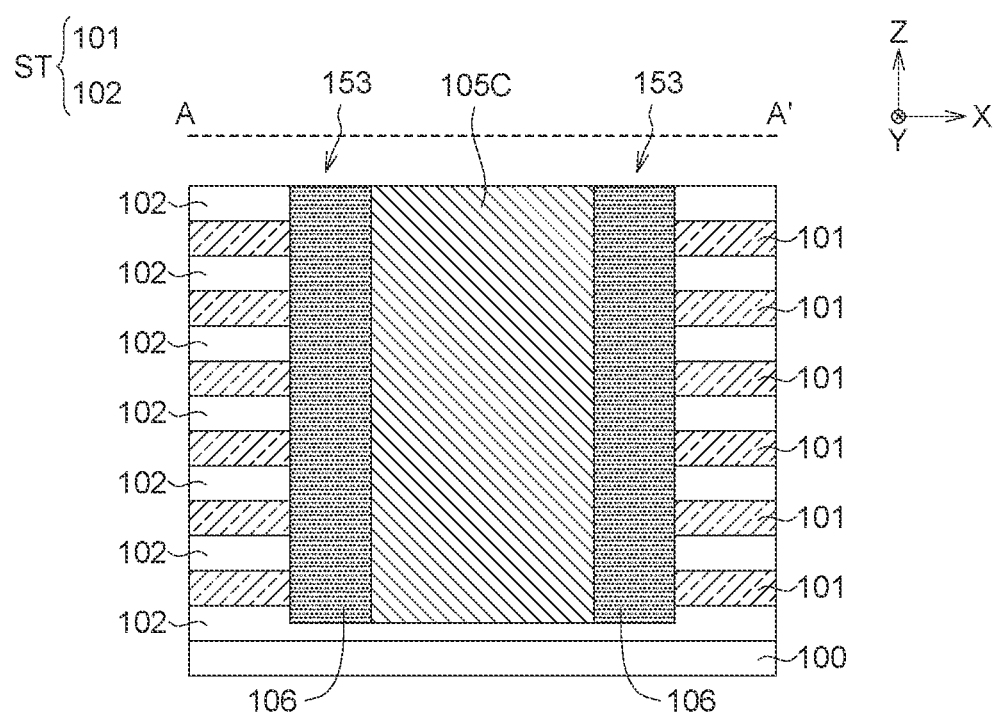

Referring to FIGS. 7A-7C, FIG. 7A illustrates a schematic top view of a structure at a stage of the manufacturing method, FIG. 7B illustrates a schematic top view of the structure, corresponding to the plane of the first insulating layer 101, at the stage of the manufacturing method, and FIG. 7C is a cross-sectional view of the structure at the stage illustrated along the lines AA' shown in FIGS. 7A-7B. Source pillar structures 106 are formed in the stack structure ST. The source pillar structures 106 are separated from each other. The source pillar structures 106 are formed in the first holes 153. The source pillar structures 106 may directly contact the stack structure ST and/or the oxide structures 103C and/or the channel structure 104C and/or the insulating pillar structures 105C. The source pillar structure 106 may include a conductive material or a semiconductor material such as doped polycrystalline silicon. In an embodiment, the source pillar structure 106 includes polycrystalline silicon doped with n-type dopants (N+ polycrystalline silicon). In an embodiment, the material of source pillar structures is filled in the first holes 153 and on the stack structure ST through a deposition process; a portion of the material of source pillar structures on the stack structure ST is then removed through a chemical-mechanical planarization process, and a portion of the material of source pillar structures in the first holes 153 remains. The portion of the material of source pillar structures in the first holes 153 may be defined as the source pillar structures 106.

Figure 8A:
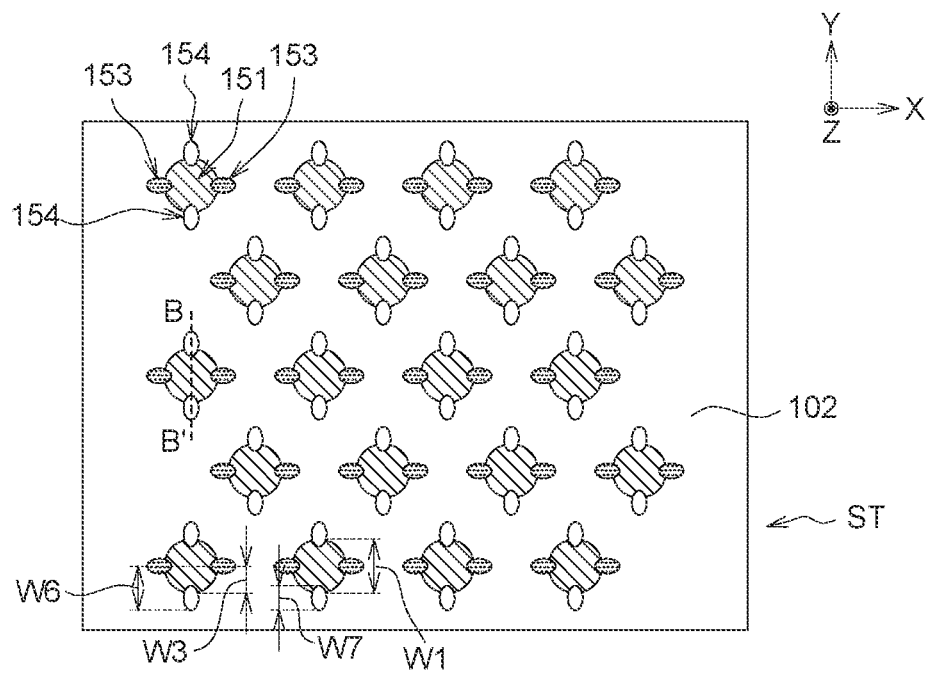
Figure 8B:
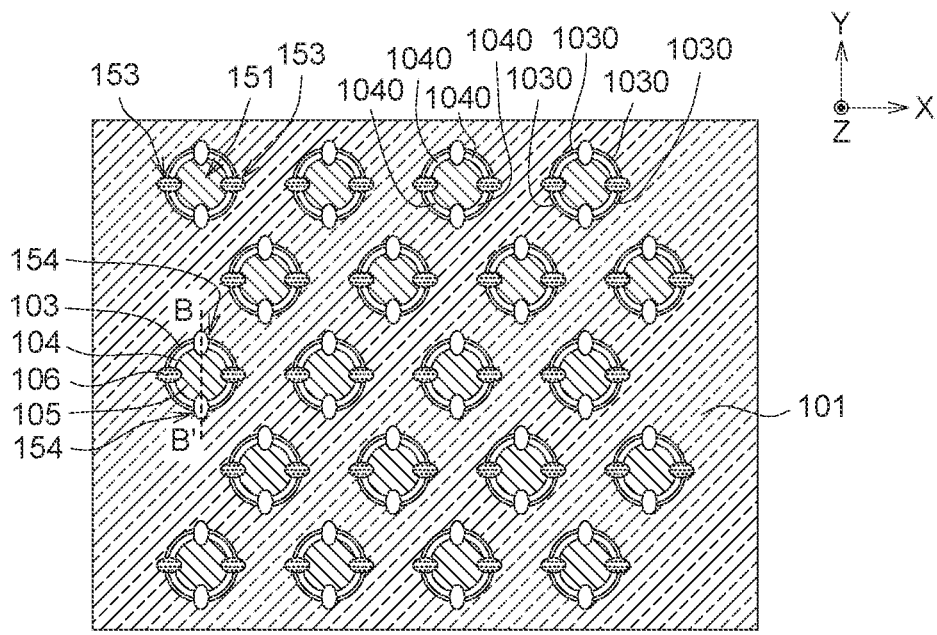
Figure 8C:
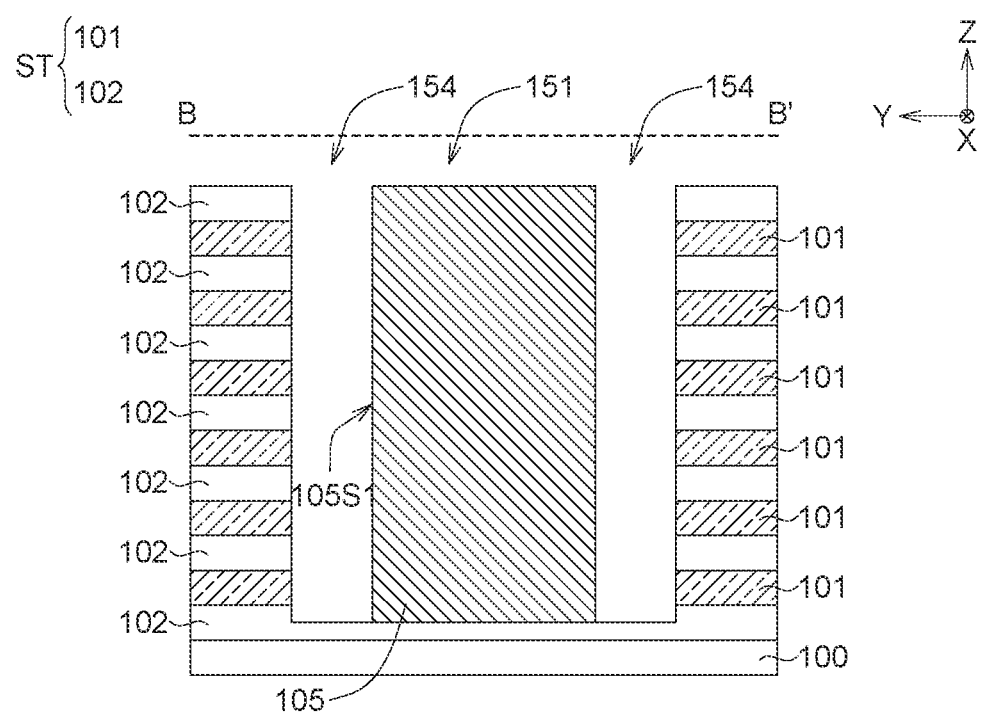

Referring to FIGS. 8A-8C, FIG. 8A illustrates a schematic top view of a structure at a stage of the manufacturing method, FIG. 8B illustrates a schematic top view of the structure, corresponding to the plane of the first insulating layer 101, at the stage of the manufacturing method, and FIG. 8C is a cross-sectional view of the structure at the stage illustrated along the lines BB' shown in FIGS. 8A-8B. The stack structure ST is patterned so that second holes 154 penetrating the stack structure ST are formed. The second holes 154 are separated from each other. Each of the openings 151 partly overlaps more than one second hole 154. In the present embodiment, each of the openings 151 partly overlaps two second holes 154, the two second holes 154 can be disposed on opposite sides of the opening 151 along the Y direction, but the present disclosure is not limited thereto. The number and arrangement of the second holes 154 that partly overlap an opening 151 can be adjusted freely. Each second hole 154 is partly within an opening 151 and partly outside the opening 151. The second hole 154 may have any shape such as a cylindrical shape, an elliptical cylindrical shape, or a square cylindrical shape. In an embodiment, the number of the first holes 153 is equal to the number of the second holes 154. The first holes 153 and the second holes 154 are separated from each other. Each of the openings 151 may correspond to (i.e. partly overlap with) the first holes 153 and the second holes 154, and these first holes 153 and these second holes 154 may be disposed alternately and surround the corresponding opening 151. The second holes 154 extend downward along the Z direction, penetrate the stack structure ST, the oxide structures 103C, the channel structures 104C and the insulating pillar structures 105C, and stop at the bottommost second insulating layer 102 in the stack structure ST. In an embodiment, the stack structure ST is patterned through a photolithography process to form the second holes 154. The step of forming the second holes 154 may include removing a portion of the stack structure ST, a portion of the oxide structures 103C, a portion of the channel structures 104C and a portion of the insulating pillar structures 105C; the remainder of the oxide structures 103C may be defined as the oxide structures 103; the remainder of the channel structures 104C may be defined as the channel structures 104; the remainder of the insulating pillar structures 105C may be defined as the insulating pillar structures 105.

In the present embodiment, the second holes 154 expose sidewalls of the stack structure ST, sidewalls of the oxide structures 103, sidewalls of the channel structures 104 and outer surfaces 105S1 of the insulating pillar structures 105, and expose the bottommost second insulating layer 102 in the stack structure ST (which may be considered as bottoms of the second holes 154). An oxide structures 103 corresponding an opening 151 can be divided into four arc oxide parts 1030 (as shown in FIG. 8B) separated from each other by two first holes 153 and two second holes 154. A channel structures 104 corresponding an opening 151 can be divided into four arc channel parts 1040 (as shown in FIG. 8B)

separated from each other by two first holes 153 and two second holes 154. As shown in FIG. 8A, in a plane formed by the X direction and the Y direction, a maximum distance W6 between an edge of the second hole 154 and a central point of the opening 151 is greater than the radius W3 of the opening 151. In the present embodiment, in a plane formed by the X direction and the Y direction, the second hole 154 has a maximum width W7 smaller than the diameter W1 of the opening 151, but the present disclosure is not limited thereto.

Figure 9A:
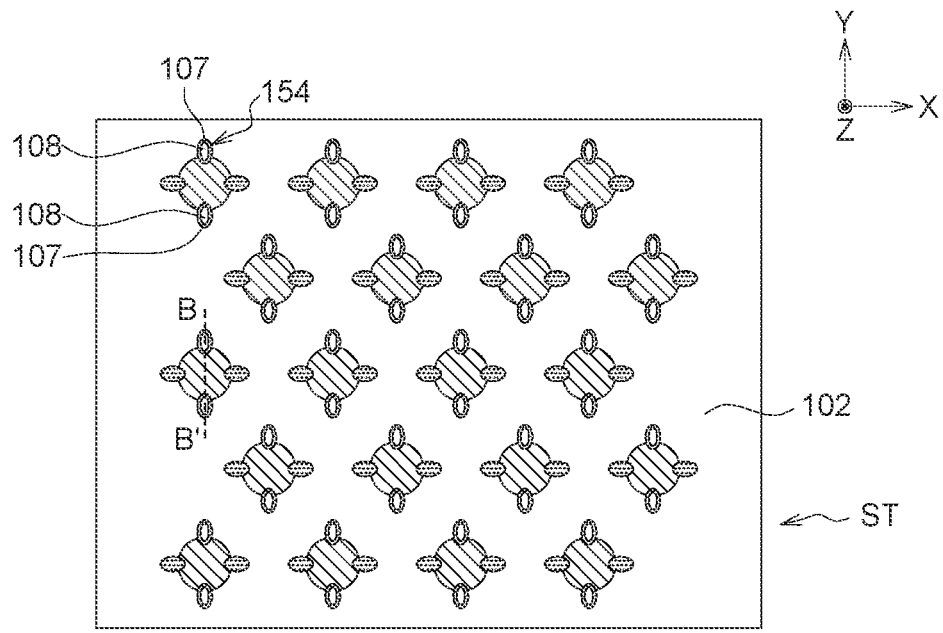
Figure 9B:
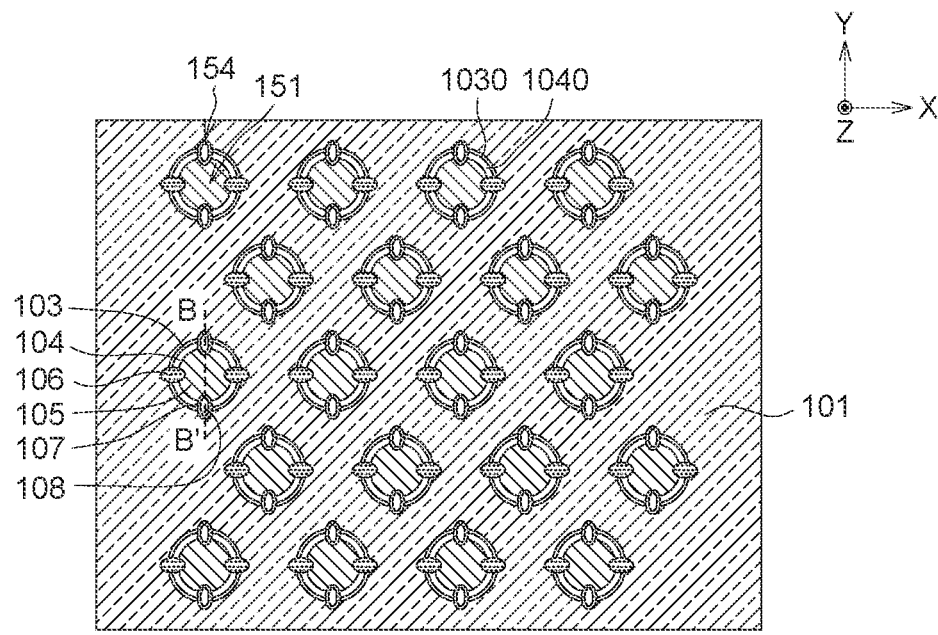
Figure 9C:
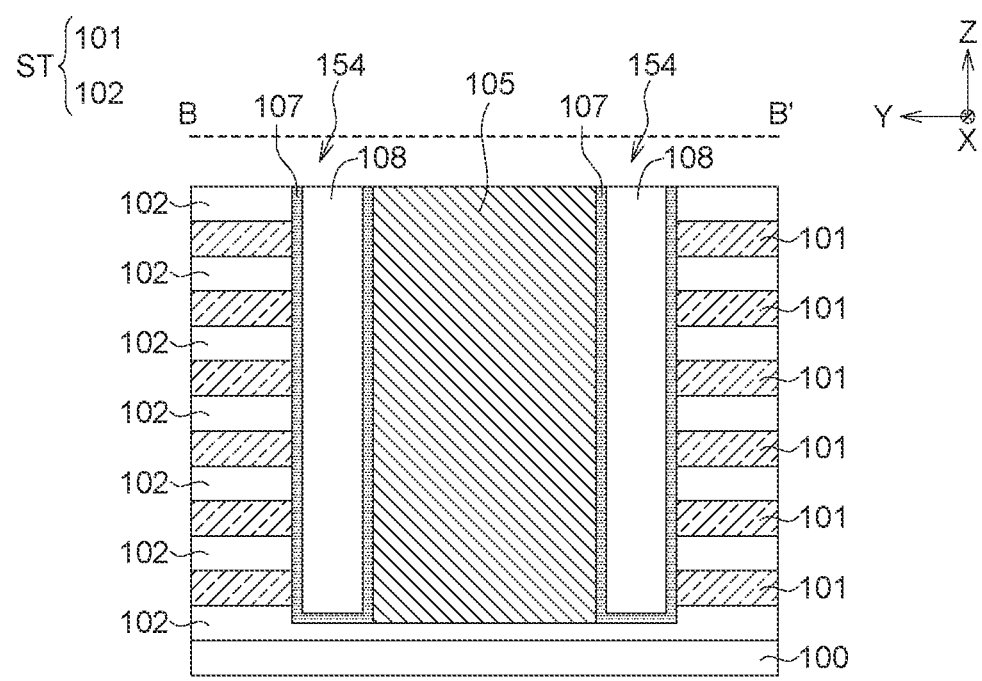

Referring to FIGS. 9A-9C, FIG. 9A illustrates a schematic top view of a structure at a stage of the manufacturing method, FIG. 9B illustrates a schematic top view of the structure, corresponding to the plane of the first insulating layer 101, at the stage of the manufacturing method, and FIG. 9C is a cross-sectional view of the structure at the stage illustrated along the lines BB' shown in FIGS. 9A-9B. Memory structures 107 and drain pillar structures 108 are formed in the stack structure ST. The memory structure 107 surrounds the drain pillar structure 108. The drain pillar structure 108 is separated from the stack structure ST, the oxide structure 103, the channel structure 104 and the insulating pillar structure 105 by the memory structure 107; the term "separated from" used herein means physical separation, but it does not mean that these components must not be electrically connected. The memory structure 107 and the drain pillar structure 108 are formed in the second hole 154. The memory structure 107 may directly contact the stack structure ST and/or the oxide structures 103 and/or the channel structure 104 and/or the insulating pillar structures 105. The drain pillar structure 108 may directly contact the memory structure 107.

The memory structure 107 may include a resistive memory material, such as transition metal oxide, conductive bridging memory material, phase change memory material, magnetoresistive memory material or other suitable materials. For example, the memory structure 107 may include metal oxide, such as tungsten oxide ($WO_x$), nickel oxide (NiO), niobium (V) oxide ($Nb_2O_5$), copper oxide ($CuO_x$), tantalum (V) oxide ($Ta_2O_5$), aluminum oxide ($Al_2O_3$), cobalt oxide (CoO), hafnium oxide ($HfO_x$), titanium dioxide ($TiO_2$), strontium titanate ($SrTiO_3$), strontium zirconate ($SrZrO_3$) and $(BaSr)TiO_3$, or chalcogenide alloy, such as gallium-antimony alloy (Ga/Sb), indium antimony alloy (In/Sb), indium selenium alloy (In/Se), antimony tellurium alloy (Sb/Te), germanium tellurium alloy (Ge/Te), germanium antimony tellurium alloy (Ge/Sb/Te), indium antimony tellurium alloy (In/Sb/Te), gallium selenium tellurium alloy (Ga/Se/Te), tin antimony tellurium alloy (Sn/Sb/Te), indium antimony germanium alloy (In/Sb/Ge), Silver indium antimony tellurium alloy (Ag/In/Sb/Te), germanium tin antimony tellurium alloy (Ge/Sn/Sb/Te), germanium antimony selenium tellurium alloy (Ge/Sb/Se/Te) and tellurium germanium antimony sulfur alloy (Te/Ge/Sb/S), or other suitable materials. The drain pillar structure 108 may be a multilayer structure. For example, the multilayer structure can be titanium nitride/tungsten (TiN/W), tantalum nitride/tungsten (TaN/W), or titanium/titanium nitride/tungsten (Ti/TiN/W). In an embodiment, in the drain pillar structure 108 with a multilayer structure, the layers of the multilayer structure may be arranged in concentric circles.

In an embodiment, the material of the memory structures is formed on sidewalls of the second holes 154, bottoms of the second holes 154 and the stack structure ST through a deposition process; then, the material of the drain pillar structures is filled in the remaining spaces of the second holes 154 and on the stack structure ST through a deposition process; then, a portion of the material of the memory structures above the stack structure ST and a portion of the material of the drain pillar structures above the stack structure ST are removed through a chemical-mechanical planarization process, and a portion of the material of the memory structures in the second holes 154 and a portion of the material of the drain pillar structures in the second holes 154 remains. The portion of the material of the memory structures in the second holes 154 may be defined as the memory structures 107. The portion of the material of the drain pillar structures in the second holes 154 may be defined as the drain pillar structures 108.

In a plane formed by the Y direction and the Z direction (as shown in FIG. 9C), and/or in a plane formed by the X direction and the Z direction, the memory structure 107 may have a U-shaped section, but the present disclosure is not limited thereto. In other embodiments, the memory structure 107 may has an annular shape, that is, the memory structure 107 is only formed on the sidewall of the second hole 154, but not formed on the bottom of the second hole 154. In other embodiments, the memory structure 107 may be formed on the sidewall and the bottom of the second hole 154, but the memory structure 107 on the bottom of the second hole 154 does not continuously extend (i.e. the memory structure 107 may only cover a portion of the bottom of the second hole 154).

Figure 10A:
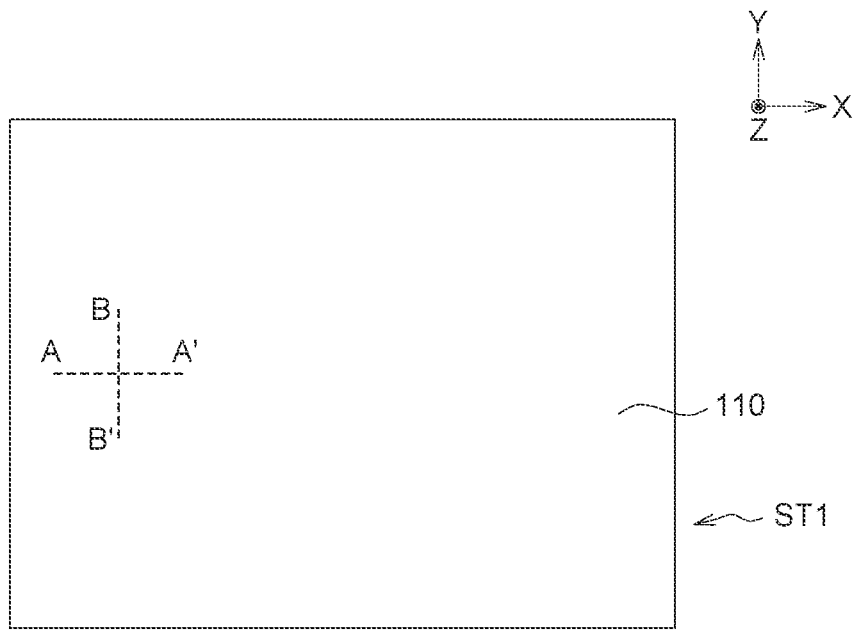
Figure 10B:
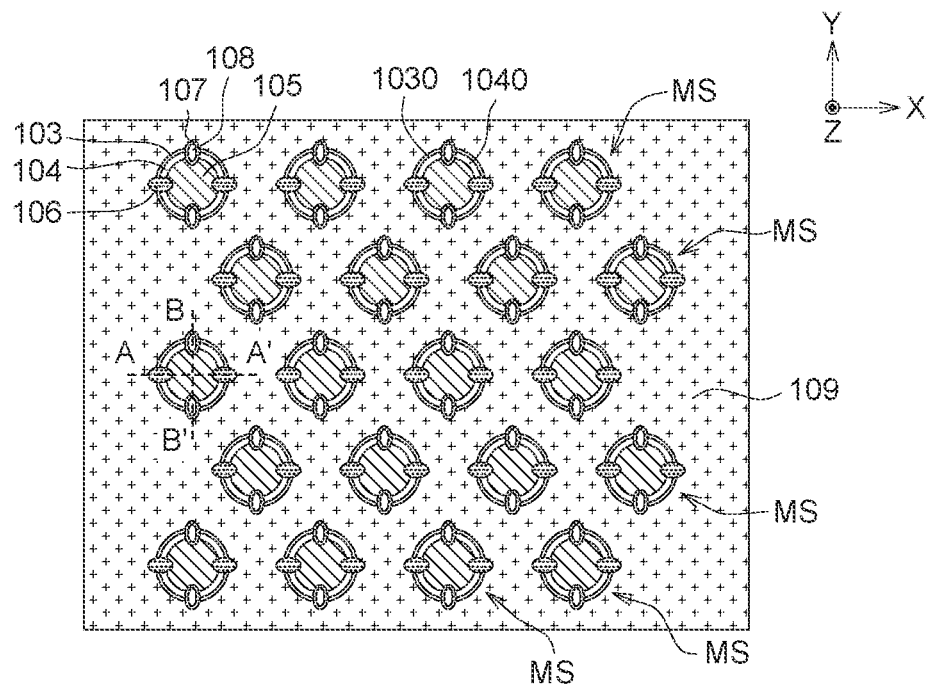
Figure 10C:
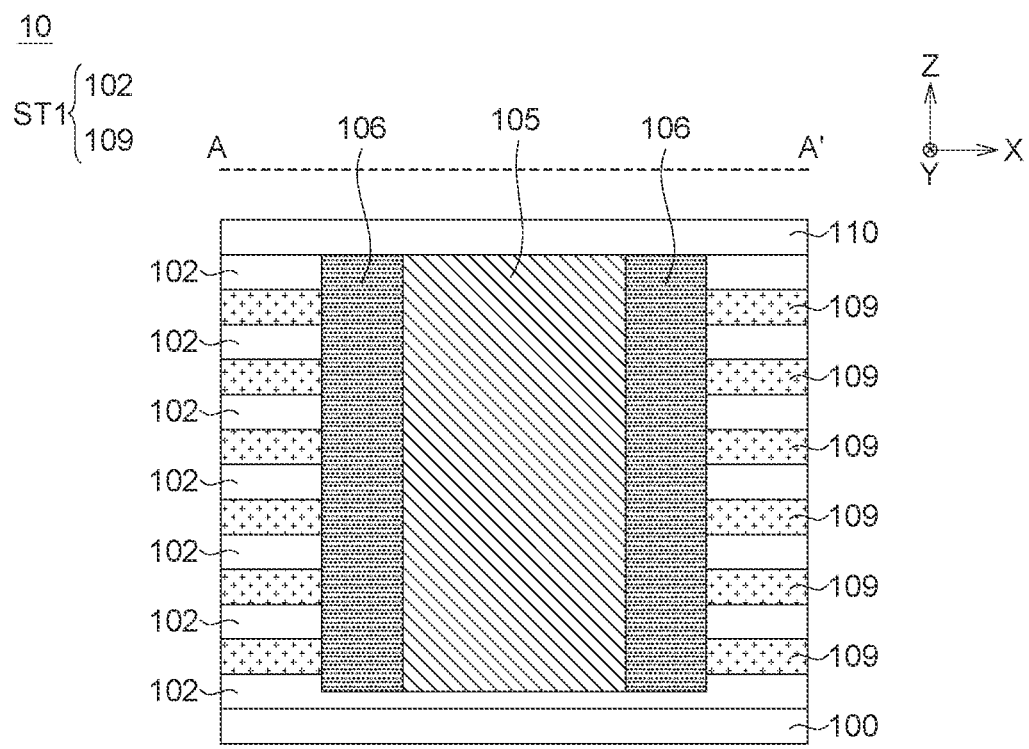
Figure 10D:
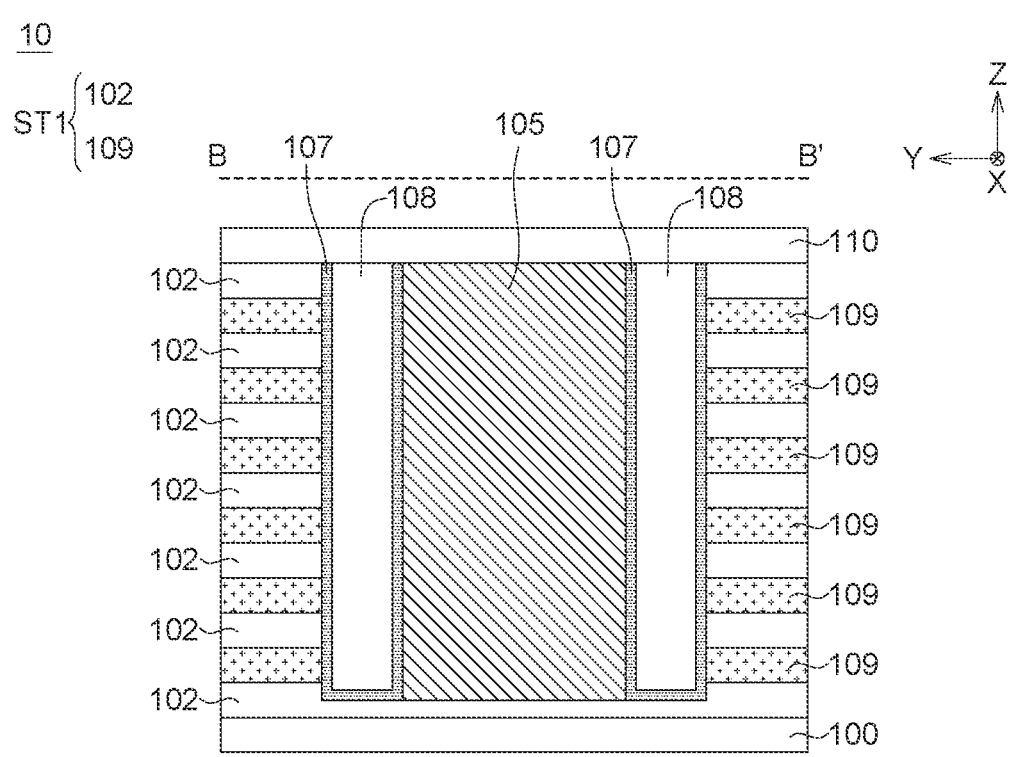

Referring to FIGS. 10A-10D, FIG. 10A illustrates a schematic top view of a structure at a stage of the manufacturing method, FIG. 10B illustrates a schematic top view of the structure, corresponding to a plane of a conductive layer 109, at the stage of the manufacturing method, FIG. 10C is a cross-sectional view of the structure at the stage illustrated along the lines AA' shown in FIGS. 10A-10B, and FIG. 10D is a cross-sectional view of the structure at the stage illustrated along the lines BB' shown in FIGS. 10A-10B. The first insulating layers 101 of the stack structure ST are replaced with conductive layers 109, so that a stack structure ST1 including the conductive layers 109 and the second insulating layers 102 stacked alternately is formed. A cover layer 110 is formed on the stack structure ST1. The conductive layer 109 may be a multilayer structure. For example, the multilayer structure can be titanium nitride/tungsten (TiN/W). The cover layer 110 may include an insulating material, and the insulating material includes oxide such as silicon oxide. In an embodiment, a selectively etching process is performed on the stack structure ST to remove the first insulating layers 101 and keep the second insulating layers 102; the conductive layers 109 are then formed between the second insulating layers 102 through a deposition process. The cover layer 110 may be formed on the stack structure ST1 through a deposition process.

In an embodiment, after removing the first insulating layers 101, barrier layers can be formed on sidewalls of the memory structures (the exposed sidewalls after removing the first insulating layers 101) through a deposition process, and then the deposition process is performed to form the conductive layers 109. The barrier layer may include oxide or a dielectric material. The barrier layer can be used to electrically isolate the conductive layers 109 from the memory structures 107. The barrier layer can be used as gate oxide of the channel structure 104.

In an embodiment, through the method schematically illustrated in FIGS. 1A-10D, a memory device 10 is provided. The memory device 10 includes the substrate 100, the stack structure ST1, memory strings MS and the cover layer 110. The stack structure ST1 is on the substrate 100. The stack structure ST1 includes the conductive layers 109 that can be used as a gate structure of the memory device 10, and the second insulating layers 102 between the conductive layers 109. The cover layer 110 is on the stack structure ST1. The memory strings MS are disposed apart in the stack structure ST1. In an embodiment, the memory strings MS can be arranged in the stack structure ST1 in a hexagonal array. The gate structure surrounds the memory strings MS. Each of the memory strings MS includes source pillar structures 106, drain pillar structures 108, memory structures 107 surrounding the drain pillar structures 108 respectively, the channel structure 104, the oxide structure 103 and the insulating pillar structure 105. The source pillar structures 106 and the drain pillar structures 108 extend along the Z direction (e.g. a third direction). The source pillar structure 106 is partly connected to the insulating pillar structure 105 and partly connected to the gate structure.

A channel structure 104 is divided into the arc channel parts 1040 by the drain pillar structures 108 and the source pillar structures 106. Two ends of each of the arc channel parts 1040 are connected to the source pillar structure 106 and the memory structure 107, respectively. An oxide structure 103 is divided into the arc oxide parts 1030 by the drain pillar structures 108 and the source pillar structures 106. Two ends of each of the arc oxide parts 1030 are connected to the source pillar structure 106 and the memory structure 107, respectively. The oxide structure 103 is between the channel structure 104 and the gate structure. The memory structure 107 is between the arc channel part 1040 and the drain pillar structure 108. The insulating pillar structure 105 is surrounded by the channel structure 104. The insulating pillar structure 105 extends along the Z direction. As shown in FIG. 10B, the source pillar structures 106 are disposed apart along the X direction (e.g. a first direction), and the drain pillar structures 108 are disposed apart along the Y direction (e.g. a second direction).

The memory device 10 includes memory units. Each memory unit includes a transistor and a resistive memory cell (1T1R). The resistive memory cells may be defined in the memory structures 107 at intersections between the drain pillar structures 108 and the channel structures 104. The memory device 10 includes word lines (WL) electrically connected to the gate structure, bit lines electrically connected to the drain pillar structures 108, and source lines electrically connected to the source pillar structures 106. In an embodiment, resistive memory cells defined in a memory structure 107 may be electrically connected to the same bit line.

Figure 11:
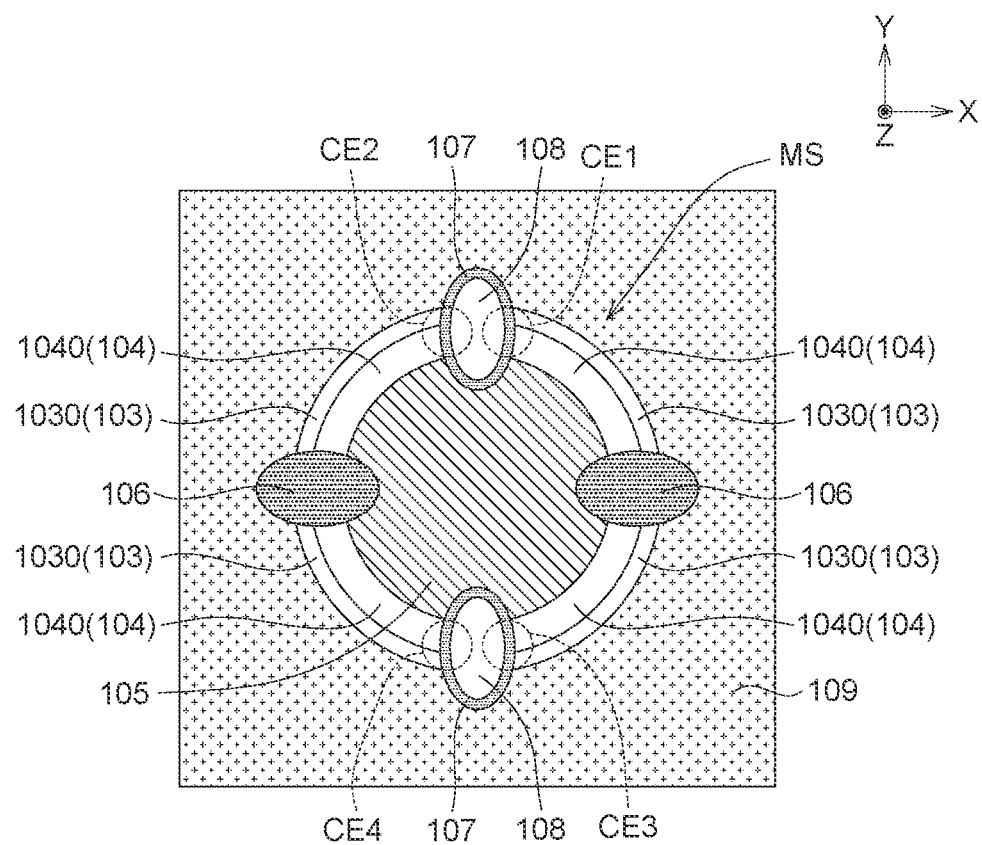
FIG. 11 illustrates a schematic top view of a memory device according to an embodiment of the present disclosure.

A unipolar operation and a bipolar operation can be performed in the memory device according to the present disclosure. Some of the operations which can be performed in the memory device according to the present disclosure will be exemplarily described below with reference to FIG. 11. FIG. 11 illustrates a cross-sectional view of a memory string MS in the memory device 10 according to an embodiment of the present disclosure. The memory device 10 includes a resistive memory cell CE1, a resistive memory cell CE2, a resistive memory cell CE3 and a resistive memory cell CE4. The resistive memory cell CE1 and the resistive memory cell CE2 are defined in the memory structure 107 at intersections between the channel structures 104 and the upper drain pillar structure 108 in FIG. 11. The resistive memory cell CE3 and the resistive memory cell CE4 are defined in the memory structure 107 at intersections between the channel structures 104 and the lower drain pillar structure 108 in FIG. 11. In a unipolar operation, an operation bias voltage (e.g. a "read" bias voltage ($V_{READ}$), a "set" bias voltage (VSET) or a "reset" bias voltage ($V_{RESET}$)) is applied to the bit line electrically connected to the upper drain pillar structure 108, a grounded voltage (e.g. 0V) is applied to the source line electrically connected to the right source pillar structure 106, the bit line electrically connected to the lower drain pillar structure 108 is electrically floating, and the source line electrically connected to the left source pillar structure 106 is electrically floating; the resistive memory cell CE1 is selected to for operation (such as a "read" operation, a "set" operation or a "reset" operation), and the resistive memory cells CE2~CE4 are not selected. In a bipolar operation, an operation bias voltage (e.g. a "read" bias voltage ($V_{READ}$) or a "reset" bias voltage ($V_{RESET}$)) is applied to the bit line electrically connected to the upper drain pillar structure 108, a grounded voltage (e.g. 0V) is applied to the source line electrically connected to the right source pillar structure 106, the bit line electrically connected to the lower drain pillar structure 108 is electrically floating, and the source line electrically connected to the left source pillar structure 106 is electrically floating; the resistive memory cell CE1 is selected to for operation (such as a "read" operation or a "reset" operation), and the resistive memory cells CE2~CE4 are not selected. In a bipolar operation, a grounded voltage (e.g. 0V) is applied to the bit line electrically connected to the upper drain pillar structure 108, an operation bias voltage (e.g. a "set" bias voltage ($V_{SET}$)) is applied to the source line electrically connected to the right source pillar structure 106, the bit line electrically connected to the lower drain pillar structure 108 is electrically floating, and the source line electrically connected to the left source pillar structure 106 is electrically floating; the resistive memory cell CE1 is selected to for operation (such as a "set" operation), and the resistive memory cells CE2~CE4 are not selected.

As shown in FIGS. 10A-10D, a memory string MS of the memory device 10 includes two source pillar structures 106 and two drain pillar structures 108. The present disclosure is not limited thereto. The present disclosure can be applied to the memory device including several source pillar structures (for example, two or more source pillar structures) and several drain pillar structures (for example, two or more drain pillar structures) in a memory string. In an embodiment, the present disclosure can be applied to the memory device including N source pillar structures and N drain pillar structures in a memory string, and N is one of the positive integers greater than or equal to 2.

When N is one of the positive integers greater than or equal to 2, a memory string of the memory device includes N source pillar structures, N drain pillar structures, N memory structures, a channel structure, an oxide structure and an insulating pillar structure. The N memory structures surround the N drain pillar structures respectively. The channel structure is divided into 2N arc channel parts by the N drain pillar structures and the N source pillar structures. The oxide structure is divided into 2N arc oxide parts by the N drain pillar structures and the N source pillar structures. The N drain pillar structures and the N source pillar structures are disposed alternately and surround the insulating pillar structure. In this memory string, there are 2N resistive memory cells corresponding to the same level, and 2N bits of data can be stored in these resistive memory cells.

The memory device according to the present disclosure may include single-level cells (SLC), which can store only one bit per memory cell, or multi-level cells (MLC), which can store more than one bits per memory cell. The multi-level cells may include double-level cells (DLC), triple-level cells (TLC), quad-level cells (QLC) and so on.

In a comparative example, the memory structure of the memory device is disposed along the channel structure, the contact area between the memory structure and the channel structure is large, resulting in a large RESET current. In a comparative example, the gate structure of the memory device only control a portion of the channel structure, so that the leakage paths will exist in a portion of the channel structure that is not controlled by the gate structure.

In the memory device according to the present disclosure, the memory structure surround the drain pillar structure and is not disposed along the channel structure; through such an arrangement, the contact area between the memory structure and the channel structure in the present disclosure is small, which can greatly reduce the RESET current and improve the electrical performance of the memory device as compared with the comparative example. In addition, in the memory device according to the present disclosure, the channel structure in formed in the recesses so that all channel structures can be controlled by the gate structure; through such an arrangement, the memory device of the present disclosure can avoid or reduce the formation of leakage paths, improve the problem of leakage current and improve the electrical performance of the memory device as compared with the comparative example.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
    drain pillar structures;
    source pillar structures;
    memory structures surrounding the drain pillar structures respectively;
    a channel structure divided into arc channel parts by the drain pillar structures and the source pillar structures; and
    a gate structure surrounding the drain pillar structures, the source pillar structures and the channel structure,
    wherein two ends of each of the arc channel parts are connected to one of the source pillar structures and one of the memory structures.

2. The memory device according to claim 1, wherein the source pillar structures are disposed apart along a first direction, the drain pillar structures are disposed apart along a second direction perpendicular to the first direction.

3. The memory device according to claim 1, wherein the memory structures comprises resistive memory materials.

4. The memory device according to claim 1, wherein the memory structures are disposed between the arc channel parts and the drain pillar structures.

5. The memory device according to claim 1, further comprising an insulating pillar structure, the channel structure surrounds the insulating pillar structure, one of the source pillar structures is partly connected to the insulating pillar structure and partly connected to the gate structure.

6. The memory device according to claim 1, wherein each of the memory structures has a U-shaped section.

7. The memory device according to claim 1, wherein the memory device comprises N drain pillar structures, N source pillar structures and N memory structures, the channel structure is divided into 2N arc channel parts by the drain pillar structures and the source pillar structures, N is one of the positive integers greater than or equal to 2.

8. The memory device according to claim 7, further comprising an oxide structure between the channel structure and the gate structure, the oxide structure is divided into 2N arc oxide parts by the drain pillar structures and the source pillar structures.

9. The memory device according to claim 1, wherein the channel structure comprises channel layers disposed apart along a third direction, the drain pillar structures and the source pillar structures extend along the third direction.

10. A method for manufacturing a memory device, comprising:
    providing a stack structure;
    forming an opening penetrating the stack structure;
    forming a channel structure in the stack structure, wherein the opening exposes an inner surface of the channel structure;
    forming first holes penetrating the stack structure, wherein the opening partly overlaps the first holes, and the first holes penetrate the channel structure;
    forming a source pillar structure in each of the first holes;
    forming second holes penetrating the stack structure, wherein the opening partly overlaps the second holes, and the second holes penetrate the channel structure;
    forming a memory structure and a drain pillar structure in each of the second holes; and
    forming a gate structure surrounding the drain pillar structures and the source pillar structures.

11. The method for manufacturing the memory device according to claim 10, wherein the channel structure is divided into arc channel parts by the first holes and the second holes.

12. The method for manufacturing the memory device according to claim 10, wherein a maximum distance between an edge of the first holes and a central point of the opening is greater than a radius of the opening in a plane.

13. The method for manufacturing the memory device according to claim 10, wherein a maximum distance between an edge of the second holes and a central point of the opening is greater than a radius of the opening in a plane.

14. The method for manufacturing the memory device according to claim 10, wherein each of the first holes or each of the second holes is partly within the opening, and each of the first holes or each of the second holes is partly outside the opening.

15. The method for manufacturing the memory device according to claim 10, wherein the memory structure is formed on a sidewall and a bottom of each of the second holes and surrounds the drain pillar structure.

16. The method for manufacturing the memory device according to claim 10, wherein the stack structure comprises first insulating layers and second insulating layers stacked alternately, the step of forming the channel structure comprises removing a portion of the first insulating layers to form recesses between the second insulating layers, and the channel structure is formed in the recesses.

17. The method for manufacturing the memory device according to claim 16, wherein a recess width of the recesses is greater than a diameter of the opening in a plane.

18. The method for manufacturing the memory device according to claim 16, further comprising forming an oxide structure in the recesses, and the oxide structure surrounds the channel structure.

19. The method for manufacturing the memory device according to claim 10, further comprising forming an insulating pillar structure in the opening, and the first holes and the second holes expose an outer surface of the insulating pillar structure.

* * * * *